(12) United States Patent
Ma

(10) Patent No.: US 11,194,193 B2
(45) Date of Patent: Dec. 7, 2021

(54) MASK ASSEMBLY, MASK APPARATUS AND MASK CONTROL METHOD

(71) Applicants: BOE Technology Group Co., Ltd., Beijing (CN); Beijing BOE Display Technology Co., Ltd., Beijing (CN)

(72) Inventor: Guojing Ma, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 168 days.

(21) Appl. No.: 16/542,395

(22) Filed: Aug. 16, 2019

(65) Prior Publication Data

US 2020/0057344 A1 Feb. 20, 2020

(30) Foreign Application Priority Data

Aug. 16, 2018 (CN) .......................... 201810939837.0

(51) Int. Cl.
| | |
|---|---|
| *G02F 1/1337* | (2006.01) |
| *G02F 1/1362* | (2006.01) |
| *G03F 7/20* | (2006.01) |
| *G03F 1/54* | (2012.01) |

(Continued)

(52) U.S. Cl.
CPC ...... *G02F 1/133788* (2013.01); *G02F 1/1362* (2013.01); *G02B 26/004* (2013.01); *G02B 26/005* (2013.01); *G02F 1/13625* (2021.01); *G03F 1/50* (2013.01); *G03F 1/54* (2013.01); *G03F 7/70291* (2013.01)

(58) Field of Classification Search
CPC ............. G02F 1/1362; G02F 1/136209; G02F 1/13625; G03F 7/70291; G03F 1/50; G03F 1/54; G02B 26/005; G02B 26/004
USPC ................ 430/5, 321; 428/1.1, 1.3; 359/290
See application file for complete search history.

(56) References Cited

U.S. PATENT DOCUMENTS

| | | | |
|---|---|---|---|
| 2007/0134560 A1 | 6/2007 | Dirksen et al. | |
| 2012/0263941 A1* | 10/2012 | Chang .................. | C23C 14/022 428/336 |
| 2012/0320445 A1 | 12/2012 | Yang et al. | |

(Continued)

FOREIGN PATENT DOCUMENTS

| | | |
|---|---|---|
| CN | 201867584 U | 6/2011 |
| CN | 102269867 A | 12/2011 |

(Continued)

OTHER PUBLICATIONS

First office action of Chinese application No. 201810939837.0 dated Nov. 20, 2020.

*Primary Examiner* — Ruiyun Zhang
(74) *Attorney, Agent, or Firm* — Fay Sharpe LLP

(57) ABSTRACT

The present disclosure provides a mask assembly, a mask apparatus and a mask control method, pertaining to the field of mask technology. The mask assembly includes a mask plate and a controller. The mask plate includes a plurality of mask units. The mask unit has a light transmission state and a light interruption state. The controller is used to control the mask unit to switch between the light transmission state and the light interruption state to adjust a light transmission region of the mask plate. The present disclosure solves the problem that mask efficiency is low. The present disclosure is used to mask film layers.

20 Claims, 8 Drawing Sheets

(51) Int. Cl.
*G03F 1/50* (2012.01)
*G02B 26/00* (2006.01)

(56) References Cited

U.S. PATENT DOCUMENTS

| | | |
|---|---|---|
| 2017/0176738 A1 | 6/2017 | Manukyan et al. |
| 2018/0095360 A1 | 4/2018 | Wang et al. |
| 2019/0276367 A1* | 9/2019 | Tanaka ................ C04B 35/6268 |

FOREIGN PATENT DOCUMENTS

| | | |
|---|---|---|
| CN | 202615040 U | 12/2012 |
| CN | 103941392 A | 7/2014 |
| CN | 105549319 A | 5/2016 |
| CN | 108169998 A | 6/2018 |
| CN | 108369334 A | 8/2018 |

* cited by examiner

Mask units in a mask assembly are controlled to switch between a light transmission state and a light interruption state to adjust light transmission regions in the mask assembly — 1001

MASK ASSEMBLY, MASK APPARATUS AND MASK CONTROL METHOD

This application claims priority to Chinese Patent Application No.: 201810939837.0, filed on Aug. 16, 2018 and entitled "MASK PLATE ASSEMBLY AND CONTROL METHOD THEREOF", the entire contents of which are incorporated herein by reference.

TECHNICAL FIELD

The present disclosure relates to the field of mask technology, and particularly relates to a mask assembly, a mask apparatus and a mask control method.

BACKGROUND

With the development of science, liquid crystal display panels are more and more widely used. A liquid crystal display panel generally includes two display substrates that are oppositely arranged, and a liquid crystal arranged between the two display substrates. An alignment film is arranged on one side of each display substrate facing towards the liquid crystal. During manufacturing of the liquid crystal display panels, alignment is performed for an alignment material layer by using a mask apparatus.

The mask apparatus includes a mask plate and an ultraviolet lamp component. When the alignment is performed for the alignment material layer by using the mask plate, the mask plate may be arranged on one side of the alignment material layer, and the ultraviolet lamp component emits ultraviolet light from the other side of the mask plate to the mask plate, such that the ultraviolet light passes through a light transmission region in the mask plate and reaches the alignment material layer to form an alignment film.

SUMMARY

The present disclosure provides a mask assembly, a mask apparatus and a mask control method, and the technical solution is as follows.

In an aspect, a mask assembly is provided, the mask assembly comprises: a mask plate and a controller, the mask plate comprising a plurality of mask units; wherein the mask unit has a light transmission state and a light interruption state, the controller is electrically connected to the mask unit, and the controller is used to control the mask unit to be switched between the light transmission state and the light interruption state to adjust a light transmission region of the mask plate.

Optionally, the plurality of mask plates is arranged in an array.

Optionally, the mask unit comprises: a light transmission bearing structure, and a light interruption liquid on the light transmission bearing structure, wherein the light transmission bearing structure has a lyophilic state and a lyophobic state; and the controller is electrically connected to the light transmission bearing structure in the mask unit, and the controller is used to control the light transmission bearing structure to switch from the lyophobic state to the lyophilic state such that the mask unit switches from the light transmission state to the light interruption state, and control the light transmission bearing structure to switch from the lyophilic state to the lyophobic state such that the mask unit switches from the light interruption state to the light transmission state.

Optionally, the light transmission bearing structure is in the lyophobic state when a voltage is applied, and is in the lyophilic state when the voltage is interrupted; and the controller is used to apply the voltage to the light transmission bearing structure such that the light transmission bearing structure switches from the lyophilic state to the lyophobic state, and interrupt the voltage to the light transmission bearing structure such that the light transmission bearing structure switches from the lyophobic state to the lyophilic state.

Optionally, a material of the light transmission bearing structure comprises white nanographene.

Optionally, a side of the light transmission bearing structure near the light interruption liquid is convex.

Optionally, a surface of the side the light transmission bearing structure near the light interruption liquid comprises: two flat faces convex towards the light interruption liquid, and an edge connecting the two flat faces.

Optionally, the two flat faces have the same area.

Optionally, the mask plane further comprises: a light transmission substrate and a light transmission protection layer that are oppositely arranged, and a light interruption grid structure between the light transmission substrate and the light transmission protection layer; wherein the mask units are between the light transmission substrate and the light transmission protection layer, the light interruption grid structure partitions the light transmission substrate into a plurality of cells, the plurality of mask units is in one-to-one correspondence with the plurality of cells, and each mask unit is in a corresponding cell.

Optionally, the mask units are sealed by the light transmission substrate, the light transmission protection layer and the light interruption grid structure.

Optionally, a plurality of convex structures are arranged on a side of the light transmission substrate near the light transmission bearing structures, the plurality of convex structures is in one-to-one correspondence with the plurality of cells, and each convex structure in a corresponding cell; the mask unit comprises a sheet-like light transmission bearing structure, and a light interruption liquid on the light transmission bearing structure, wherein the light transmission bearing structure is attached on the convex structure in the cell where the light transmission bearing structure is, and the light transmission bearing structure has a lyophilic state and a lyophobic state; and the controller is electrically connected to the light transmission bearing structure in the mask unit, and the controller is used to control the light transmission bearing structure to be in the lyophilic state such that the mask unit is in the light interruption state, and control the light transmission bearing structure to be in the lyophobic state such that the mask unit is in the light transmission state.

Optionally, the plurality of mask units is arranged in an array, and the mask units are sealed by the light transmission substrate, the light transmission protection layer and the light interruption grid structure;

a surface of the side the light transmission bearing structure near the light interruption liquid comprises: two flat faces convex towards the light interruption liquid, and an edge connecting the two flat faces, wherein the two flat faces having the same area; and a material of the light transmission bearing structure comprises: white nanographene, the light transmission bearing structure is in the lyophobic state when a voltage is applied, and is in the lyophilic state when the voltage is interrupted; and the controller is used to apply the voltage to the light transmission bearing structure such that the light transmission bearing structure is in the lyophobic state, and interrupt the voltage to the light transmission bearing structure such that the light transmission bearing structure is in the lyophilic state.

In another aspect, a mask apparatus is provided, the mask apparatus comprises: a mask assembly and a light emitting element; wherein the mask assembly comprises: a mask plate and a controller, the mask plate comprising a plurality of mask units; wherein the mask unit has a light transmission state and a light interruption state, the controller is electrically connected to the mask unit, and the controller is used to control the mask unit to be switched between the light transmission state and the light interruption state to adjust a light transmission region of the mask plate; and the light emitting element is used to emit light to the mask plate.

Optionally, the light emitting element is electrically connected to the controller in the mask assembly, and the controller is used to control the light emitting element to emit a polarized light of any one of a plurality of polarization directions.

Optionally, the light emitting element comprises a ultraviolet lamp component.

In still another aspect, a mask control method is provided, the method is applied to the controller in the mask assembly described above, wherein the mask assembly comprises a mask plate, the mask plate comprising a plurality of mask units, the mask unit has a light transmission state and a light interruption state, and the controller is electrically connected to the mask unit; and the method comprises:

controlling the mask unit to switch between the light transmission state and the light interruption state to adjust a light transmission region of the mask plate.

Optionally, the mask unit comprises a light transmission bearing structure and a light interruption liquid on the light transmission bearing structure, wherein the light transmission bearing structure has a lyophilic state and a lyophobic state; and controlling the mask unit to switch between the light transmission state and the light interruption state comprises:

controlling the light transmission bearing structure to switch from the lyophobic state to the lyophilic state, such that the mask unit switches from the light transmission state to the light interruption state; and controlling the light transmission bearing structure to switch from the lyophilic state to the lyophobic state, such that the mask unit switches from the light interruption state to the light transmission state.

Optionally, the light transmission bearing structure is in the lyophobic state when a voltage is applied, and is in the lyophilic state when the voltage is interrupted; and controlling the light transmission bearing structure to switch from the lyophobic state to the lyophilic state comprises:

interrupting the voltage to the light transmission bearing structure, such that the light transmission bearing structure is in the lyophilic state; and controlling the light transmission bearing structure to switch from the lyophilic state to the lyophobic state comprises:

applying the voltage to the light transmission bearing structure, such that the light transmission bearing structure is in the lyophobic state.

Optionally, the controller is electrically connected to the light emitting element in a mask apparatus where the mask assembly is; and the method further comprises:

controlling the light emitting element to emit a polarized light in any one of a plurality of polarization directions.

DETAILED DESCRIPTION

In order to describe the principles, technical solutions and advantages in the embodiments of the present more clearly, the present disclosure will be described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

In the related art, when a plurality of film layers having different sizes are masked by using a mask apparatus, different mask plates need to be used. Frequency replacement of the mask plate is time consuming. The embodiments of the present disclosure provide a mask assembly. When a plurality of film layers having different sizes are masked by using a mask apparatus comprising the mask assembly, different mask plates do not need to be used. This prevents time consumed for frequently replacing the mask plate, and thus working efficiency of the mask apparatus is improved.

Figure 1:
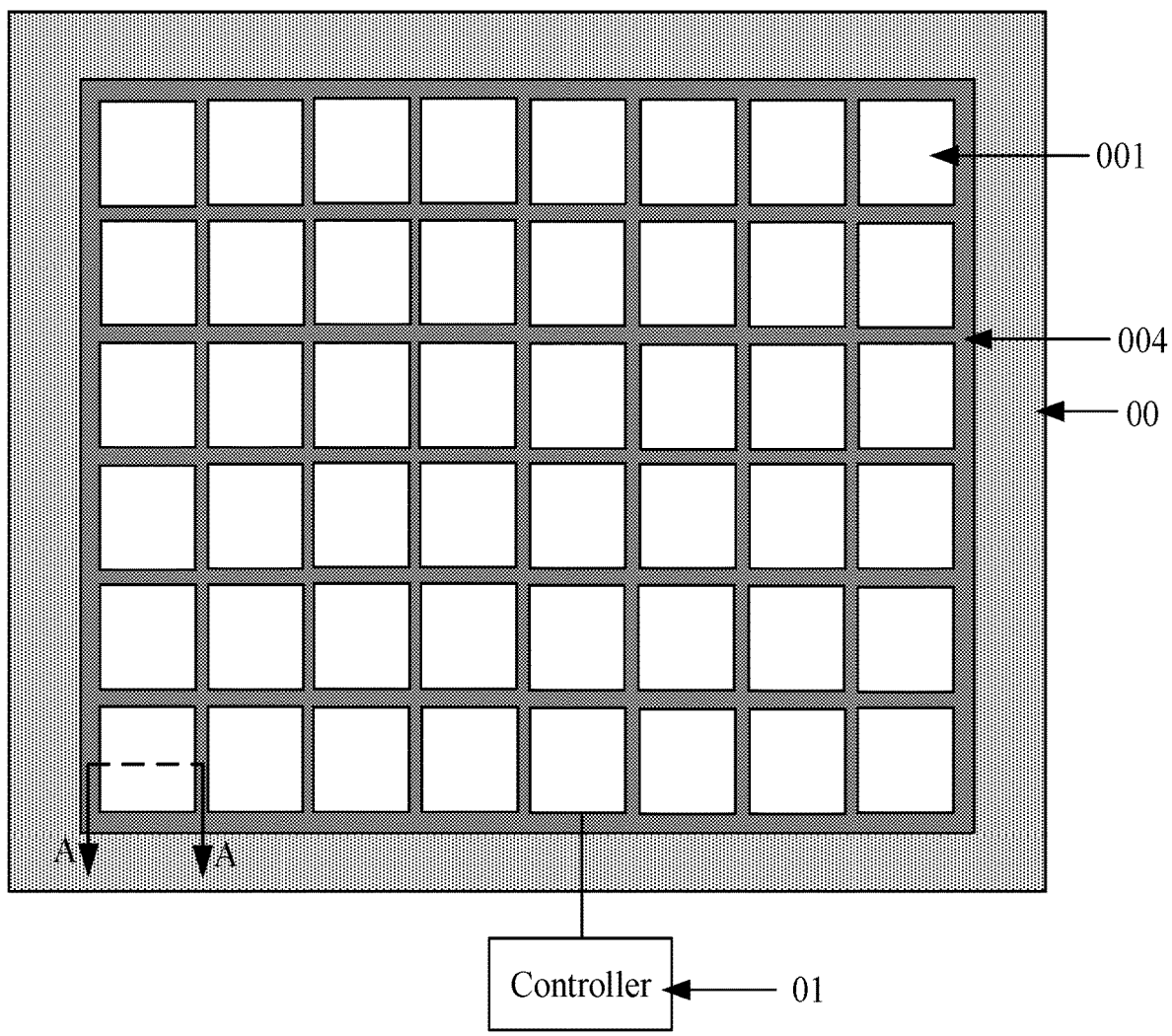
FIG. 1 is a schematic structural view of a mask assembly according to an embodiment of the present disclosure.

FIG. 1 is a schematic structural view of a mask assembly according to an embodiment of the present disclosure. As illustrated in FIG. 1, the mask assembly 0 may include a mask plate 00 and a controller 01. The mask plate 00 may include a plurality of mask units 001. The controller 01 is connected to each of the mask units 001 (FIG. 1 only illustrates a connection relation between the controller 01 and one mask unit 001 in the plurality of mask units 001).

Each mask unit 001 has a light transmission state and a light interruption state. The controller 01 may be used to control the mask unit 001 to switch between the light transmission state and the light interruption state to adjust a light transmission region in the mask assembly 0. It should be noted that the mask unit 001 does not transmit light when the mask unit 001 is in the light interruption state. The mask unit 001 transmits light when the mask unit 001 is in the light transmission state.

Figure 2:
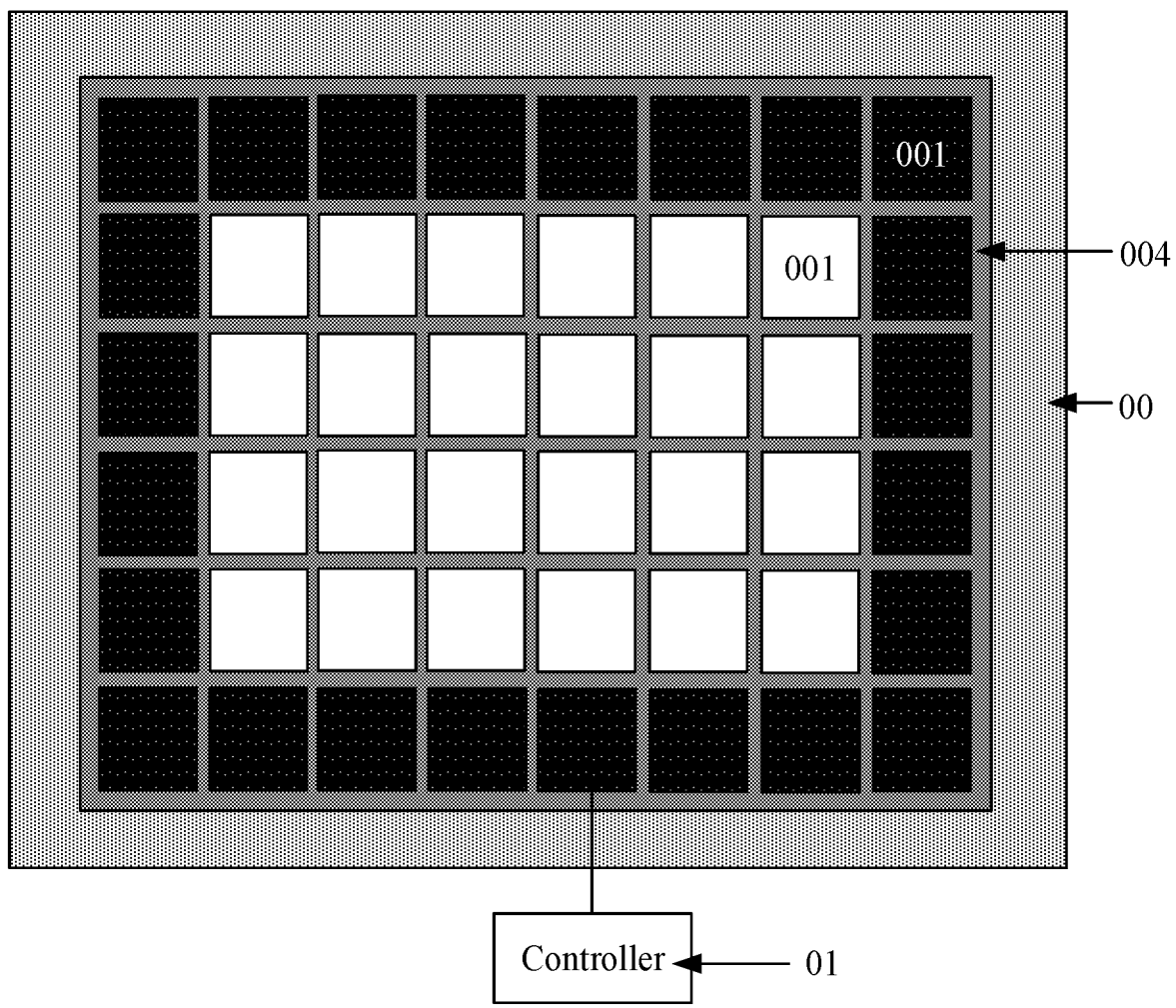
FIG. 2 is a schematic view of a light transmission region having a second size in the mask assembly in FIG. 1.

Exemplarily, as illustrated in FIG. 1, the controller 01 may control all the mask units 001 in the mask plate 00 to be in the light transmission state to adjust sizes of the light transmission regions (not illustrated in FIG. 1) in the mask assembly 0 to a first size. As illustrated in FIG. 2, the controller 01 may also control one portion of the mask units in the mask plate 00 to be in the light transmission state, and control another portion of the mask units in the mask plate 00 to be in the light interruption state. The another portion of the mask units may enclose the one portion of the mask units to adjust the size of the light transmission region (not illustrated in FIG. 1) in the mask assembly 0 to a second size. The second size may be any size that is smaller than the first size.

In summary, in the mask assembly according to this embodiment of the present disclosure, when a plurality of film layers are masked, the controller may control the mask units in the mask plate to switch between the light transmission state and the light interruption state to adjust the size of the light transmission region in the mask plate, such that the mask plate has a transmission region having a plurality of different sizes to accommodate the film layers having different sizes. This prevent the scenario where a plurality of mask plates having different sizes may be used during masking of the film layers having different sizes and much time is consumed, and improves mask efficiency.

It should be noted that this embodiment is illustrated only by taking the scenario where the controller 01 adjust the shape of the light transmission region in the mask assembly to a rectangular shape as an example. Optionally, the controller 01 may further adjust the shape of the light transmission region in the mask assembly 0 to other shapes (for example, an irregular shape) other than the rectangular shape, such that the mask assembly 0 may mask the film layers in other shapes. This prevents the scenario where a plurality of mask plates having different sizes may be used during masking of the film layers having different sizes and much time is consumed, and improves mask efficiency.

Optionally, the mask assembly 0 is used to mask film layers on a display panel; and in order that the controller 01 may more precisely adjust the shape of the light transmission region in the mask assembly 0, the mask units 001 may have the same shape and size with sub-pixel units in the display panel. Each sub-pixel unit is used to emit light in a color (red light, green light or blue light for example).

Optionally, the plurality of mask units 001 in the mask plate 00 are arranged in an array. It should be noted that this embodiment of the present disclosure is illustrated only by taking the scenario where the mask plate 00 in the mask assembly 0 includes six rows and eight columns of mask units 001 as an example. Optionally, the mask plate 00 in the mask assembly 0 may further include the mask units 001 in another quantity of rows and columns (for example, eight rows and ten columns), which is not limited in this embodiment of the present disclosure. Nevertheless, the plurality of mask units may also be arranged in other forms or fashions, which is not limited in this embodiment of the present disclosure.

Figure 3:
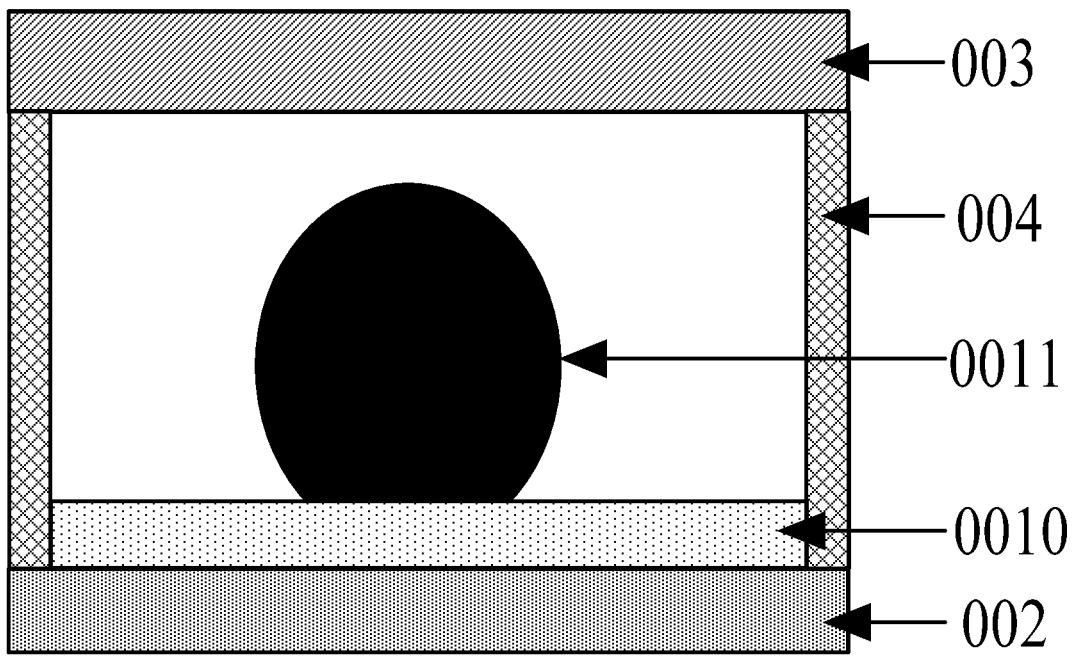
FIG. 3 is a schematic sectional view of a mask assembly according to an embodiment of the present disclosure.

FIG. 3 is a sectional view of a mask assembly 0 according to an embodiment of the present disclosure, wherein the sectional view is a schematic view of a section A-A in FIG. 1. Referring to FIG. 1 and FIG. 3, the mask unit 001 may include a light transmission bearing structure 0010 and a light interruption liquid 0011 (for example, light interruption droplets) on the light transmission bearing structure 0010, wherein the light transmission bearing structure 0010 has a lyophilic state and a lyophobic state. The controller 01 is used to control the light transmission bearing structure 0010 to switch from the lyophobic state to the lyophilic state such that the mask units 001 switch from the light transmission state to the light interruption state, and control the transmission bearing structure 0010 to switch from the lyophilic state to the lyophobic state such the mask units 001 switch from the light interruption state to the light transmission state.

Figure 4:
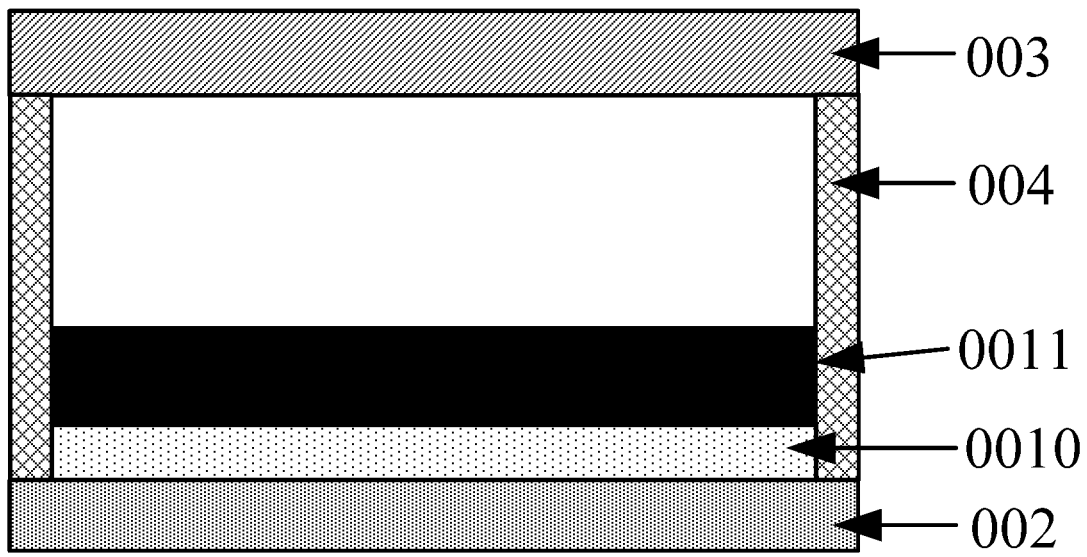
FIG. 4 is a schematic view illustrating a scenario where a light transmission bearing structure in the mask assembly in FIG. 3 is totally covered by a light interruption liquid.

Exemplarily, still referring to FIG. 1 and FIG. 3, when the light transmission bearing structure 0010 is in the lyophobic state, a cohesion force of water molecules in the light interruption liquid 0011 is greater than a mutual attractive force between solid molecules in the light transmission bearing structure 0010, such that the light interruption liquid 0011 fails to totally cover the light transmission bearing structure 0010, and such that the mask units 001 are in the light transmission state. As illustrated in FIG. 4, when the light transmission bearing structure 0010 is in the lyophilic state, a cohesion force of water molecules in the light interruption liquid 0011 is smaller than a mutual attractive force between solid molecules in the light transmission bearing structure 0010, such that the light interruption liquid 0011 totally covers the light transmission bearing structure 0010, and such that the mask units 001 are in the light interruption state.

Optionally, the light transmission bearing structure 0010 is in the lyophobic state when a voltage is applied, and is in the lyophilic state when the voltage is interrupted. The controller may apply the voltage to the light transmission bearing structure 0010, such that the light transmission bearing structure 0010 is in the lyophobic state. The controller may also interrupt the voltage to the light transmission bearing structure 0010, such that the light transmission bearing structure 0010 is in the lyophilic state. Optionally, a material of the light transmission bearing structure 0010 may be white nanographene.

Still referring to FIG. 1 and FIG. 3, the mask plate 00 in the mask assembly 0 may further include a light transmission substrate 001 and a light transmission protective layer 003 that are oppositely arranged, and a light interruption grid structure between the light transmission substrate 002 and the light transmission protective layer 003. The plurality of mask units 001 in the mask assembly 0 are all between the light transmission substrate 002 and the light transmission protective layer 003. The light interruption grid structure 004 partitions the light transmission substrate 002 into a plurality of cells (not illustrated in FIG. 1 or FIG. 3), the plurality of mask units 001 is in one-to-one correspondence with the plurality of cells, and each mask unit 001 is in a corresponding cell.

Optionally, to prevent the light interruption liquid 0011 on a light transmission bearing structure 0010 from flowing into the other mask units 001 when the controller adjusts lipophilicity or lipophobicity of the light transmission bearing structure 0010 in a mask unit 001, each mask unit 001 may be sealed by the light transmission substrate 002, the light transmission protective film layer 03 and the light interruption grid structure 003.

Figure 5:
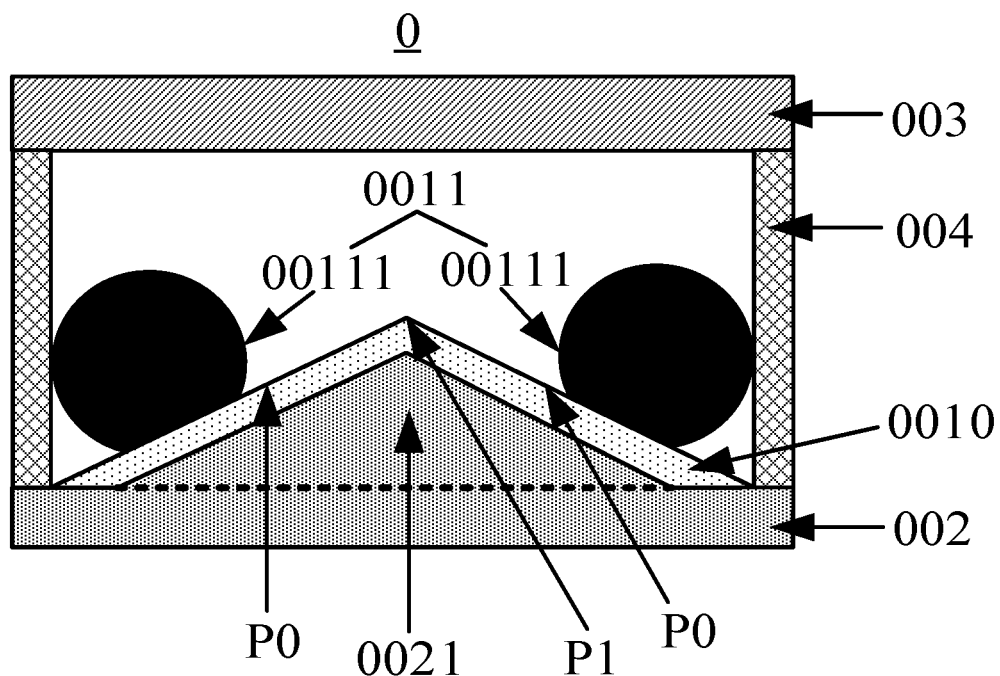
FIG. 5 is a schematic sectional view of another mask assembly according to an embodiment of the present disclosure.

FIG. 5 is a sectional view of another mask assembly 0 according to an embodiment of the present disclosure. As illustrated in FIG. 5, a side of the light transmission bearing structure 0010 in the mask assembly 0 near the light interruption liquid 0011 is convex.

Optionally, the side of the light transmission bearing structure 0010 near the light interruption liquid 0011 may be made to be convex in a plurality of ways. For example, the side of the light transmission bearing structure 0010 near the light interruption liquid 0011 may include a curved face, a flat or an irregular face which is convex and near the liquid interruption liquid 0011. In addition, this embodiment of the present disclosure is illustrated only by taking the scenario where one side of the light transmission bearing structure 0010 near the liquid interruption liquid 0011 include two flat faces P0 which are convex and near the light interruption liquid 0011 (these two flat faces may have the same area or different areas) wherein these two flat faces are connected via an edge P1 as an example.

When the controller controls the light transmission bearing structure 0010 to be in the lyophobic state, the light interruption liquid 0011 may include two light interruption sub-liquids 00111, wherein the two light interruption sub-liquids 00111 may be respectively at two sides of a top convex position (the position where the edge P1 is) on the light transmission bearing structure 0010. When a light source emits light to the light transmission protective layer 003 on a side of the light transmission protective layer 003 distal from the light transmission bearing structure 0010, the light may pass through the light transmission protective layer 003, and then is transmitted from the top convex position to the light transmission bearing structure 0010. This is favorable to the divergence of the light in the light transmission bearing structure 0010, such that an emission effect of the light from the light transmission bearing structure 0010 is improved.

Figure 6:
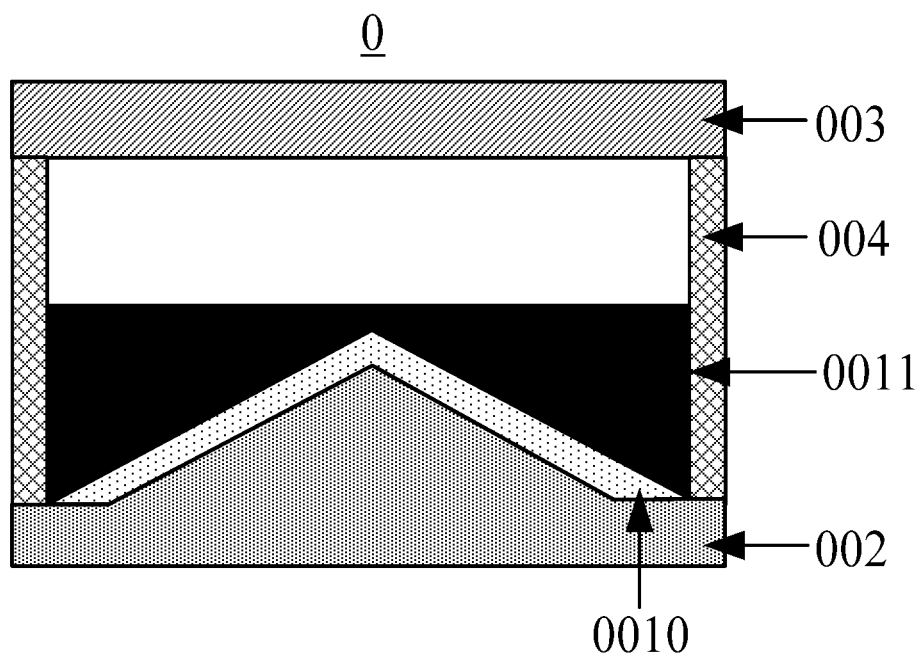
FIG. 6 is a schematic view illustrating a scenario where a light transmission bearing structure in the mask assembly in FIG. 5 is totally covered by a light interruption liquid.

As illustrated in FIG. 6, when the controller controls the light transmission bearing structure 0010 to be in the lyophilic state, the liquid interruption liquid 0011 on the light transmission bearing structure 0010 may totally cover the light transmission bearing structure 0010.

Optionally, to improve reliability of the light transmission bearing structure 0010, the light transmission bearing structure 0010 may also be attached to the light transmission substrate 002.

Optionally, a plurality of convex structures 0021 may be arranged on a side of the light transmission substrate 002 near the light transmission bearing structure 0010, wherein the plurality of convex structures 0021 is in one-to-one correspondence with the plurality of cells of the light transmission substrate 002. Each convex structure 0021 is in a corresponding cell. The light transmission bearing structure 0010 may be in a sheet-like shape, the plurality of convex structures 0021 in one-to-one correspondence with the plurality of light transmission bearing structures 0010 in the plurality of mask units 001, and each light transmission bearing structure 0010 is attached on a corresponding convex structure 0021.

This embodiment of the present disclosure is illustrated only by taking the scenario where a convex structure 0021 is formed in each cell in the light transmission substrate 002, a surface of the light transmission substrate 002 near the light transmission substrate 002 is not a single flat face, and a surface of the light transmission bearing structure 0010 near the light transmission substrate 002 is not a single flat face as an example. Optionally, the convex structure 0021 may be not formed in each cell in the light transmission substrate 002, and the surface of the light transmission substrate 002 near the light transmission bearing structure 0010 is a single flat face, and the surface of the light transmission bearing structure 0010 of the light transmission substrate 002 is also a single flat face, wherein these two flat faces may be parallel to each other, which is not limited in this embodiment of the present disclosure.

Figure 7:
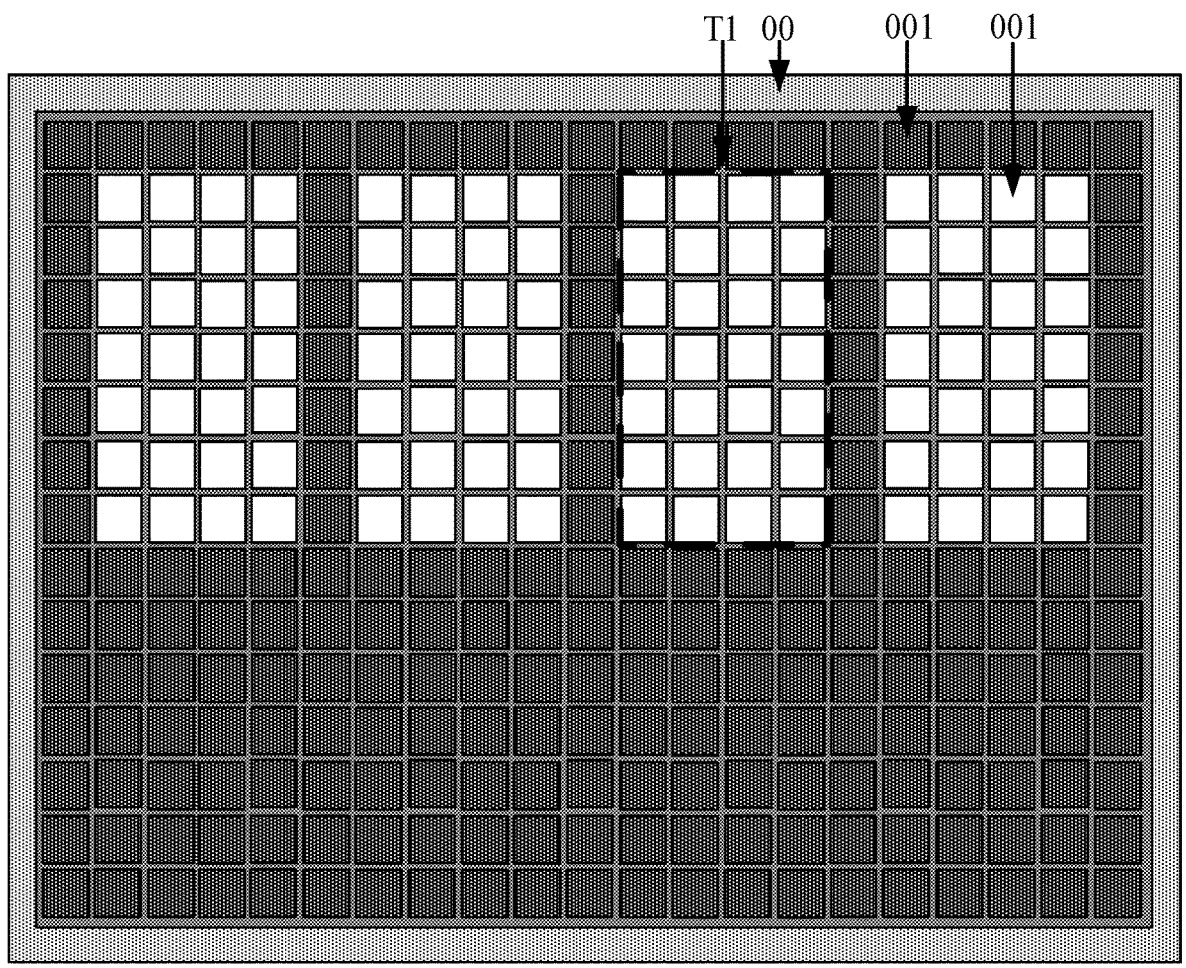
FIG. 7 is a schematic structural view of still another mask assembly according to an embodiment of the present disclosure.
Figure 8:
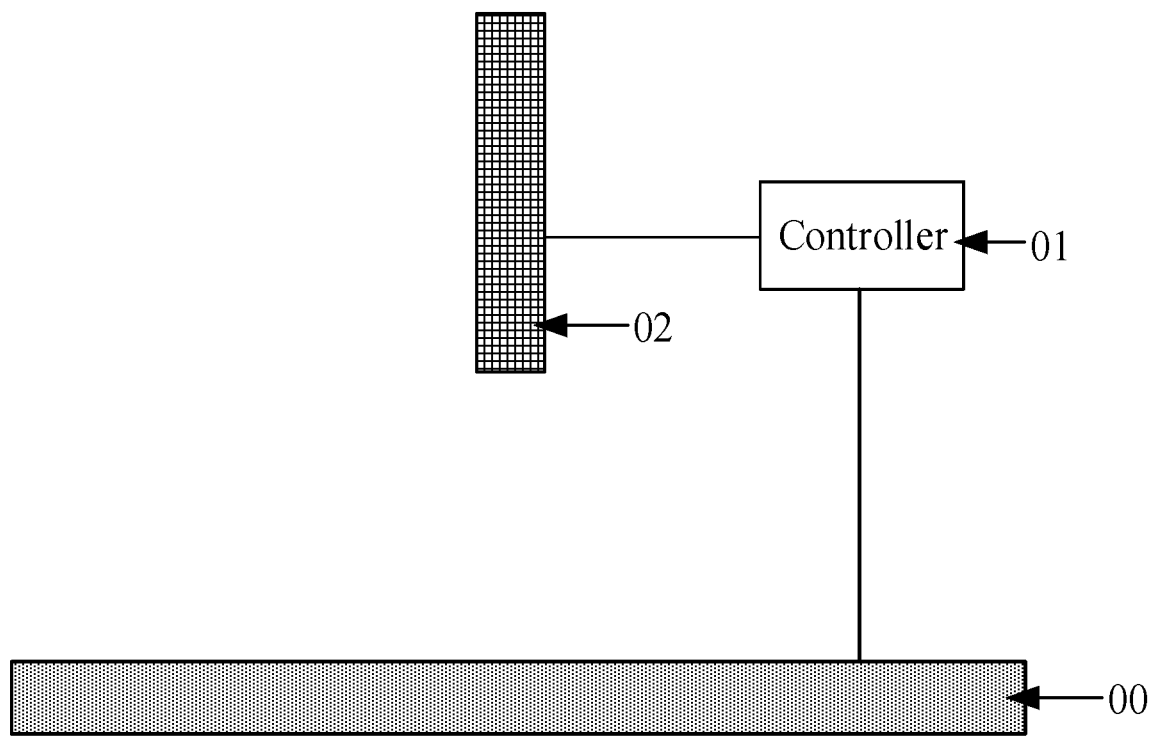
FIG. 8 is a plane view of another mask apparatus according to an embodiment of the present disclosure.

FIG. 7 is a schematic structural view of still another mask assembly 0 according to an embodiment of the present disclosure, and FIG. 8 is a plan view of a mask apparatus where a mask assembly 0 is according to an embodiment of the present disclosure. Referring to FIG. 7 and FIG. 8, the mask apparatus where the mask assembly 0 is may further include a light emitting element (for example, an ultraviolet lamp component or an infrared lamp component or the like) connected to the controller 01 and on a side of the mask plate 00. The light emitting element 02 is capable of emitting light to the mask plate 00. For example, the light emitting element 02 is capable of emitting polarized light in a plurality of polarization directions.

Optionally, the controller 01 may be electrically connected to the light emitting element 02, and the controller 01 may be further used to emit polarized light in any one of the plurality of polarization directions. Optionally, the controller 01 may be further used to control the light emitting element 02 to emit polarized light in a polarization direction to the mask plate 00 at each stage of a plurality of mask stages, wherein the polarized light emitted by the light emitting element 02 at the plurality of stages has different polarization directions.

Optionally, the controller 01 may be further used to control at least one of the plurality of mask units 001 at each of the plurality of mask stages to be in the light transmission state to define a group of light transmission regions, and control the other mask units 001 other that the at least one mask unit 001 in the plurality of mask units 001 to be in the light interruption state, wherein two groups of light transmission regions defined at any two mask stages do not overlap each other.

At each mask stage, if a film layer to be masked (not illustrated in FIG. 7 or FIG. 8) is on the other side of the mask plate 00, the polarized light in a polarization direction may pass through the one group of light transmission regions, and arrive at the film layer. If the film layer to be masked is an alignment material layer, the polarized light emitted by the light emitting element may be used to align the alignment material layer. Optionally, the film layer to be masked may also be another film layer (for example, a photoresist layer), which is not limited in this embodiment of the present disclosure.

Optionally, the plurality of mask stages may include a first mask stage and a second mask stage, and the controller 01 may be used to control a first group of mask units in the plurality of mask units 001 to be in the light transmission state at the first mask stage to define a first group of light transmission regions (the first group of light transmission regions may include four light transmission regions T1 in FIG. 7). The controller 01 may be further used to control the other mask units 001 in the plurality of mask units 001 other than the mask units 001 in the first group of light transmission regions to be in the light interruption state, and control the light emitting element 02 to emit first polarized light to the mask plate 00. In this case, if a first film layer to be masked (not illustrated in FIG. 7 or FIG. 8) is on the other side of the mask plate, and is rightly opposite to the first group of light transmission regions, the first polarized light may pass through the first group of light transmission regions, and arrive at the first film layer.

Figures 9, 10:
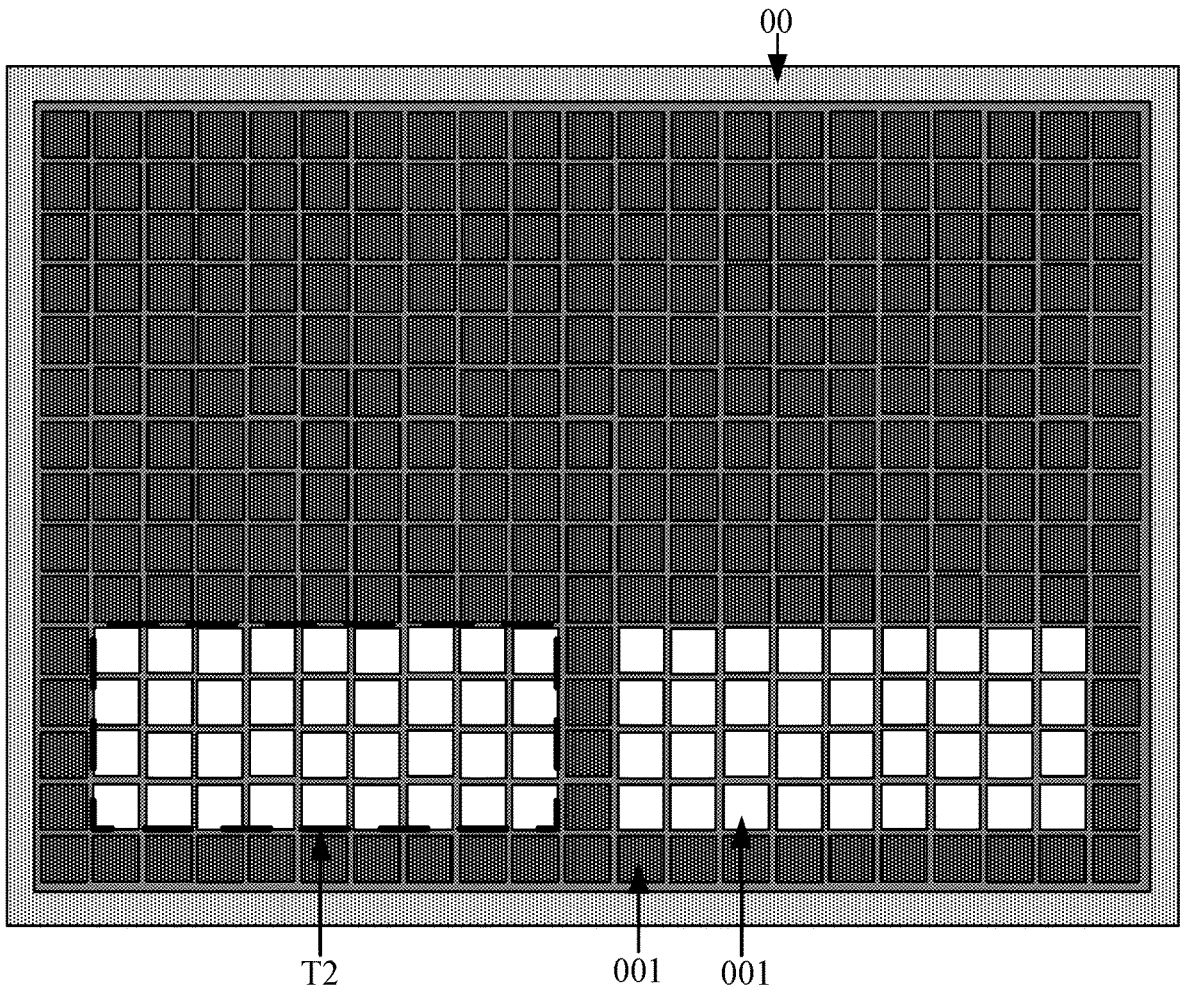
FIG. 9 is a schematic view illustrating a scenario where no light transmission region is defined in a first region and a light transmission region is defined in a second region of the mask plate in FIG. 7.
FIG. 10 is a flowchart of a mask control method according to an embodiment of the present disclosure.

The controller 01 may be further used to control a second group of mask units in the plurality of mask units 001 to be in the light transmission state at the second mask stage as illustrated in FIG. 9 to define a second group of light transmission regions (the second group of light transmission regions may include two light transmission regions T2 in FIG. 9). The controller 01 may be further used to control the other mask units 001 in the plurality of mask units 001 other than the mask units 001 in the second group of light transmission regions to be in the light interruption state, and control the light emitting element 02 to emit second polarized light to the mask plate 00. In this case, if a second film layer that is different from the first film layer and is to be masked (not illustrated in FIG. 9) is on the other side of the mask plate, and is rightly opposite to the second group of light transmission regions, the second polarized light may pass through the second group of light transmission regions, and arrive at the second film layer. In addition, the first group of mask units are different from the second group of mask units, the first group of light transmission regions do not overlap the second group of light transmission regions, and the polarization direction of the first polarized light is different from the polarization direction of the second polarized light.

Optionally, referring to FIG. 7 to FIG. 9, each light transmission region (for example, the light transmission region T1 or the light transmission region T2) may be rightly opposite to a display panel, and during manufacturing of a display panel corresponding to each light transmission region, the mask unit in each light transmission region may be used to mask a film layer forming the display panel.

It should be noted that this embodiment of the present disclosure is illustrated only by taking the scenario where the controller 01 controls the plurality of mask units 001 at two mask stages to respectively define two groups of light transmission regions as illustrated in FIG. 7 and FIG. 9 as an example. Optionally, the controller 01 may control the plurality of mask units at more than two (for example, three) mask stages to respectively define more than two (for example, three) groups of light transmission regions. In addition, the first group of light transmission regions defined at the first mask stage may further include light transmission regions T1 in another quantity (for example, five), and the second group of light transmission regions may further include light transmission regions T2 in another quantity (for example, three). The light transmission region T1 may further include mask units 001 in another quantity of rows and columns (for example, four rows and three columns), and the light transmission region T2 may further include mask units 001 in another quantity of rows and columns (for example, three rows and five columns). The light transmission region T1 and the light transmission region T2 may also be in another shape (for example, an irregular shape), which is not limited in this embodiment of the present disclosure.

In summary, in the mask assembly according to this embodiment of the present disclosure, when a plurality of film layers are masked, the controller may control the mask units in the mask plate to switch between the light transmission state and the light interruption state to adjust the size of the light transmission region in the mask plate, such that the mask plate may have a transmission region having a plurality of different sizes to accommodate the film layers having different sizes. This prevent the scenario where a plurality of mask plates having different sizes may be used during masking of the film layers having different sizes and much time is consumed, and improves mask efficiency of the mask assembly.

An embodiment of the present disclosure further provides a mask control method. The mask control method may be applied to a controller (for example, the controller 01 in the mask assembly as illustrated in FIG. 2 or FIG. 2) in the mask assembly according to the embodiments of the present disclosure. As illustrated in FIG. 10, the mask control method may include the following steps:

In step 1001, mask units in a mask assembly are controlled to switch between a light transmission state and a light interruption state to adjust light transmission regions in the mask assembly.

Exemplarily, as illustrated in FIG. 1, during the process of controlling the mask units 001 in the mask assembly 0 to switch between the light transmission state and the light interruption state, the controller 01 may control all the mask units in the mask plate 00 to be in the light transmission state to adjust the sizes of the light transmission regions in the mask assembly 0 to a first size. As illustrated in FIG. 2, the controller 01 may further control one portion of the mask units 001 in the mask plate 00 to be in the light transmission state, and control another portion of the mask units 001 in the mask plate 00 to be in the light interruption state to adjust the sizes of the light transmission regions (not illustrated in FIG. 1) in the mask assembly 0 to a second size. The second size may be any size that is smaller than the first size.

In summary, in the mask control method according to this embodiment of the present disclosure, when a plurality of film layers are masked, the mask units in the mask plate may be controlled to switch between the light transmission state and the light interruption state to adjust the size of the light transmission region in the mask plate, such that the mask plate may have a transmission region having a plurality of different sizes to accommodate the film layers having different sizes. This prevent the scenario where a plurality of mask plates having different sizes may be used during masking of the film layers having different sizes and much time is consumed, and improves mask efficiency.

It should be noted that this embodiment is illustrated only by taking the scenario where the controller 01 adjust the shapes of the light transmission regions in the mask assembly 0 to be a rectangular shape as an example. Optionally, the controller 01 may further adjust the shapes of the light transmission regions in the mask assembly 0 to another shape (for example, an irregular shape), such that the mask assembly 0 may mask film layers in another shape (for example, an irregular shape).

Figure 11:
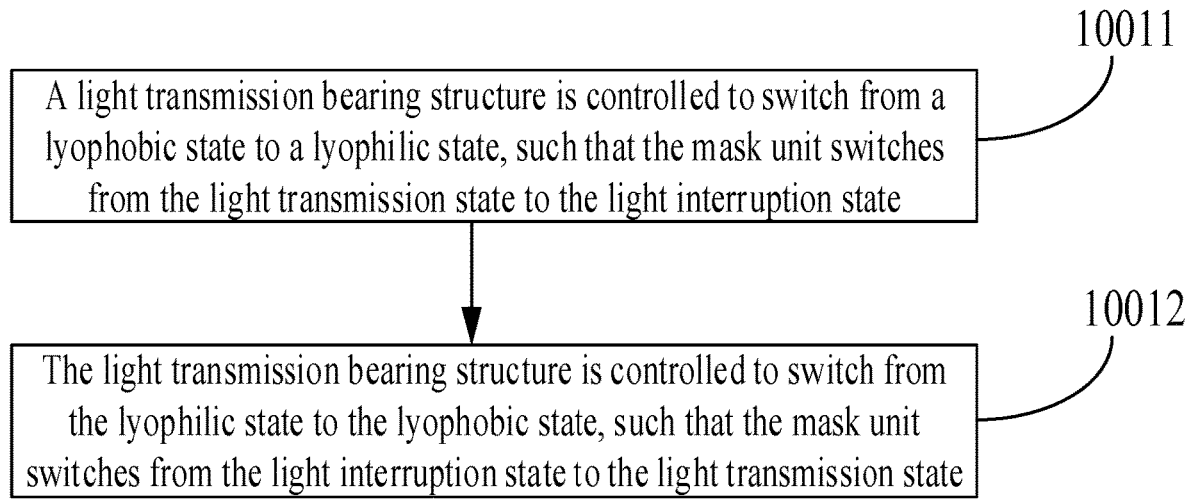
FIG. 11 is a flowchart of switching between a light transmission state and a light interruption state according to an embodiment of the present disclosure.

Optionally, as illustrated in FIG. 11, step 1001 may include the following steps.

In step 10011, a light transmission bearing structure is controlled to switch from a lyophobic state to a lyophilic state, such that the mask unit switches from the light transmission state to the light interruption state.

As illustrated in FIG. 3, during the process of controlling the light transmission bearing structure to switch from the lyophobic state to the lyophilic state, the controller may implement the process by controlling the voltage applied to the light transmission bearing structure 0010 to be interrupted.

In step 10012, the light transmission bearing structure is controlled to switch from the lyophilic state to the lyophobic state, such that the mask unit switches from the light interruption state to the light transmission state.

As illustrated in FIG. 3, the controller may further control the light transmission bearing structure 0010 to be power applied, such that the light transmission bearing structure is in the lyophobic state.

Optionally, the controller is further electrically connected to a light emitting element in a mask apparatus where the mask assembly is, and the controller may further control the light emitting element to emit polarized light to the mask plate in any one of a plurality of polarization directions. Nevertheless, the light emitting element may also not be controlled by the controller, which is not limited in this embodiment of the present disclosure.

Optionally, an embodiment of the present disclosure further provides a mask control method. The mask control method may include: controlling the light emitting element to emit polarized light in a polarization direction to the mask plate at each stage of a plurality of mask stages, wherein the polarized light emitted by the light emitting element at the plurality of stages has different polarization directions.

Optionally, controlling the mask unit to be in the light transmission state or the light interruption state includes: controlling at least one mask unit of a plurality of mask units to be in the light transmission state at each mask stage to define a group of light transmission regions, and controlling the other mask units other than the at least one mask unit in the plurality of mask units to be in the light interruption state, wherein two groups of light transmission regions defined at any one of the two mask stages do not overlap each other.

Figure 12:
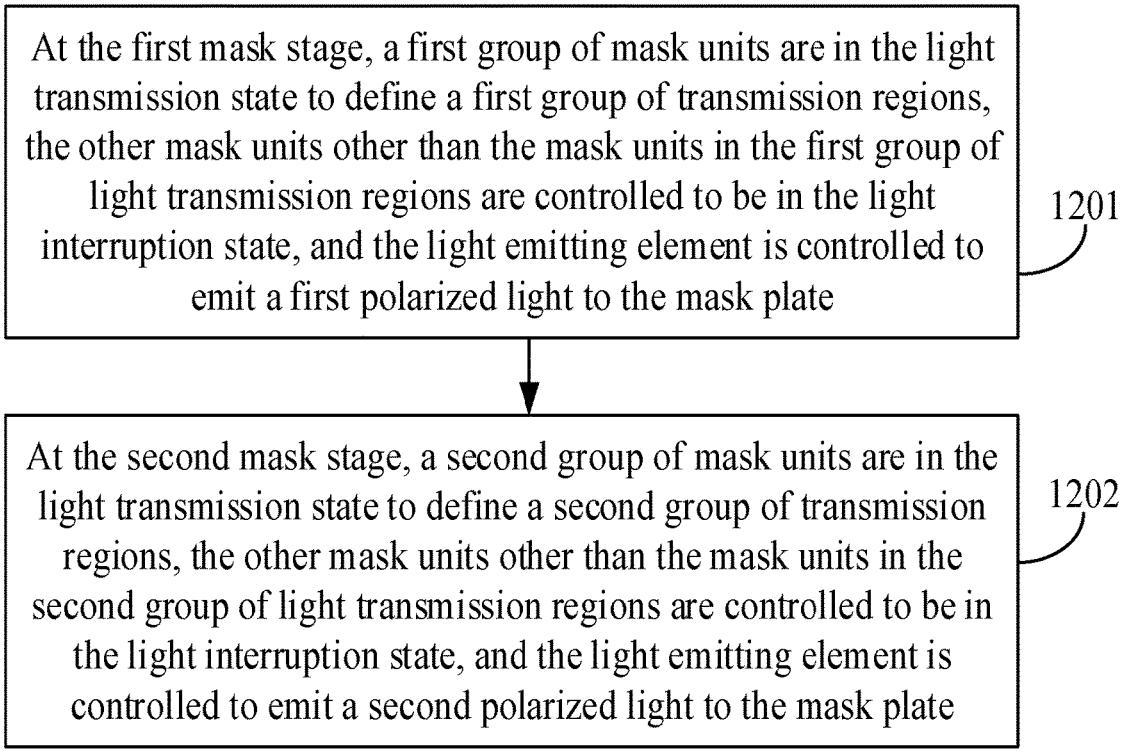
FIG. 12 is a flowchart of another mask control method according to an embodiment of the present disclosure.

Optionally, the plurality of mask stages may include a first mask stage and a second mask stage. FIG. 12 is a flowchart of a mask control method according to an embodiment of the present disclosure. As illustrated in FIG. 12, the mask control method may include the following steps.

In step 1201, at the first mask stage, a first group of mask units are in the light transmission state to define a first group of transmission regions, the other mask units other than the mask units in the first group of light transmission regions are controlled to be in the light interruption state, and the light emitting element is controlled to emit a first polarized light to the mask plate.

In step 1201, a first film layer to be masked at the first mask state is masked, and when the first film layer is masked, the first film layer is on the other side of the mask plate in the mask assembly and is rightly opposite to the first group of light transmission regions on the mask plate, and the first polarized light may pass through the first group of light transmission regions and arrive at the first film layer.

In step 1202, at the second mask stage, a second group of mask units are in the light transmission state to define a second group of transmission regions, the other mask units other than the mask units in the second group of light transmission regions are controlled to be in the light interruption state, and the light emitting element is controlled to emit a second polarized light to the mask plate.

In step 1202, a second film layer to be masked at the second mask state is masked, and when the second film layer is masked, the second film layer is on the other side of the mask plate in the mask assembly and is rightly opposite to the second group of light transmission regions on the mask plate, and the first polarized light may pass through the second group of light transmission regions and arrive at the second film layer.

In summary, in the mask control method according to this embodiment of the present disclosure, when a plurality of film layers are masked, the mask units in the mask plate may be controlled to be in the light transmission state or the light interruption state to adjust the size of the light transmission region in the mask plate, such that the mask plate may have a transmission region having a plurality of different sizes to accommodate the film layers having different sizes. This prevent the scenario where a plurality of mask plates having different sizes may be used during masking of the film layers having different sizes and much time is consumed, and improves mask efficiency.

It should be noted that the device embodiments and the corresponding method embodiments of the present disclosure may be cross referenced, which is not limited in the embodiments of the present disclosure. The sequence of the steps in the method embodiments may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

Other embodiments of the present disclosure may be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as exemplary only, and a true scope and spirit of the present disclosure is indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A mask assembly, comprising: a mask plate and a controller, the mask plate comprising a plurality of mask units each comprising: a light transmission bearing structure and a light interruption liquid on the light transmission bearing structure, wherein the light transmission bearing structure has a lyophilic state and a lyophobic state; the controller is electrically connected to the light transmission bearing structure in the mask unit; and the controller is used to control the light transmission bearing structure to switch from the lyophobic state to the lyophilic state such that the mask unit switches from the light transmission state to the light interruption state, and control the light transmission bearing structure to switch from the lyophilic state to the lyophobic state such that the mask unit switches from the light interruption state to the light transmission state, and a side of the light transmission bearing structure near the light interruption liquid is convex; and when the controller controls the light transmission bearing structure to be in the lyophobic state, the light interruption liquid includes two light interruption sub-liquids, wherein the two light interruption sub-liquids are respectively located at two sides of a top convex position on the light transmission bearing structure.

2. The mask assembly according to claim 1, wherein the plurality of mask plates is arranged in an array.

3. The mask assembly according to claim 1, wherein the light transmission bearing structure is in the lyophobic state when a voltage is applied, and is in the lyophilic state when the voltage is interrupted; and the controller is used to apply the voltage to the light transmission bearing structure such that the light transmission bearing structure switches from the lyophilic state to the lyophobic state, and interrupt the voltage to the light transmission bearing structure such that the light transmission bearing structure switches from the lyophobic state to the lyophilic state.

4. The mask assembly according to claim 3, wherein a material of the light transmission bearing structure comprises nano-sized hexagonal boron nitride.

5. The mask assembly according to claim 1, wherein a surface of the side the light transmission bearing structure near the light interruption liquid comprises: two flat faces convex towards the light interruption liquid, and an edge connecting the two flat faces.

6. The mask assembly according to claim 5, wherein the two flat faces have the same area.

7. The mask assembly according to claim 5, wherein the mask plane further comprises: a light transmission substrate and a light transmission protection layer that are oppositely arranged, and a light interruption grid structure between the light transmission substrate and the light transmission protection layer; wherein the mask units are between the light transmission substrate and the light transmission protection layer, the light interruption grid structure partitions the light transmission substrate into a plurality of cells, the plurality of mask units is in one-to-one correspondence with the plurality of cells, and each mask unit is in a corresponding cell.

8. The mask assembly according to claim 7, wherein the mask units are sealed by the light transmission substrate, the light transmission protection layer and the light interruption grid structure.

9. The mask assembly according to claim 7, wherein a plurality of convex structures are arranged on a side of the light transmission substrate near the light transmission bearing structures, the plurality of convex structures is in one-to-one correspondence with the plurality of cells, and each convex structure in a corresponding cell;

the mask unit comprises a sheet-like light transmission bearing structure, and a light interruption liquid on the light transmission bearing structure, wherein the light transmission bearing structure is attached on the convex structure in the cell where the light transmission bearing structure is, and the light transmission bearing structure has a lyophilic state and a lyophobic state; and the controller is electrically connected to the light transmission bearing structure in the mask unit, and the controller is used to control the light transmission bearing structure to be in the lyophilic state such that the mask unit is in the light interruption state, and control the light transmission bearing structure to be in the lyophobic state such that the mask unit is in the light transmission state.

10. The mask assembly according to claim 9, wherein the plurality of mask units is arranged in an array, and the mask units are sealed by the light transmission substrate, the light transmission protection layer and the light interruption grid structure;

a surface of the side the light transmission bearing structure near the light interruption liquid comprises: two flat faces convex towards the light interruption liquid, and an edge connecting the two flat faces, wherein the two flat faces having the same area; and a material of the light transmission bearing structure comprises: nano-sized hexagonal boron nitride, the light transmission bearing structure is in the lyophilic state when a voltage is applied, and is in the lyophilic state when the voltage is interrupted; and the controller is used to apply the voltage to the light transmission bearing structure such that the light transmission bearing structure is in the lyophobic state, and interrupt the voltage to the light transmission bearing structure such that the light transmission bearing structure is in the lyophilic state.

11. A mask apparatus, comprising: a mask assembly and a light emitting element; wherein the mask assembly comprises: a mask plate and a controller, the mask plate comprising a plurality of mask units each comprising: a light transmission bearing structure, and a light interruption liquid on the light transmission bearing structure, wherein the light transmission bearing structure has a lyophilic state and a lyophobic state;

the controller is electrically connected to the light transmission bearing structure in the mask unit; and the controller is used to control the light transmission bearing structure to switch from the lyophobic state to the lyophilic state such that the mask unit switches from the light transmission state to the light interruption state, and control the light transmission bearing structure to switch from the lyophilic state to the lyophobic state such that the mask unit switches from the light interruption state to the light transmission state, and a side of the light transmission bearing structure near the light interruption liquid is convex; and when the controller controls the light transmission bearing structure to be in the lyophobic state, the light interruption liquid includes two light interruption sub-liquids, wherein the two light interruption sub-liquids are respectively located at two sides of a top convex position on the light transmission bearing structure.

12. The mask apparatus according to claim 11, wherein the light emitting element is electrically connected to the controller in the mask assembly, and the controller is used to control the light emitting element to emit a polarized light of any one of a plurality of polarization directions.

13. The mask apparatus according to claim 12, wherein the light emitting element comprises an ultraviolet lamp component.

14. A mask control method, applied to a controller in a mask assembly, wherein the mask assembly comprises a mask plate, the mask plate comprising a plurality of mask units each comprising: a light transmission bearing structure and a light interruption liquid on the light transmission bearing structure, wherein the light transmission bearing structure has a lyophilic state and a lyophobic state; a side of the light transmission bearing structure near the light interruption liquid is convex; and the controller is electrically connected to the mask unit; and the method comprises:

controlling the light transmission bearing structure to switch from the lyophobic state to the lyophilic state, such that the mask unit switches from the light transmission state to the light interruption state; and controlling the light transmission bearing structure to switch from the lyophilic state to the lyophobic state, such that the mask unit switches from the light interruption state to the light transmission state, and when the controller controls the light transmission bearing structure to be in the lyophobic state, the light interruption liquid includes two light interruption sub-liquids, wherein the two light interruption sub-liquids are respectively located at two sides of a too convex position on the light transmission bearing structure.

15. The method according to claim 14, wherein the light transmission bearing structure is in the lyophobic state when a voltage is applied, and is in the lyophilic state when the voltage is interrupted; and controlling the light transmission bearing structure to switch from the lyophobic state to the lyophilic state comprises:

interrupting the voltage to the light transmission bearing structure, such that the light transmission bearing structure is in the lyophilic state; and controlling the light transmission bearing structure to switch from the lyophilic state to the lyophobic state comprises:

applying the voltage to the light transmission bearing structure, such that the light transmission bearing structure is in the lyophobic state.

16. The method according to claim 14, wherein the controller is electrically connected to the light emitting element in a mask apparatus where the mask assembly is; and the method further comprises:

controlling the light emitting element to emit a polarized light in any one of a plurality of polarization directions.

17. The method according to claim 15, wherein the controller is electrically connected to the light emitting element in a mask apparatus where the mask assembly is; and the method further comprises:

controlling the light emitting element to emit a polarized light in any one of a plurality of polarization directions.

18. The method according to claim 16, the polarized light emitted by the light emitting element at the plurality of stages has different polarization directions.

19. The method according to claim 16, further comprising: at each mask stage, controlling at least one of the plurality of mask units at each of the plurality of mask stages to be in the light transmission state to define a group of light transmission regions, wherein two groups of light transmission regions defined at any two mask stages do not overlap each other.

20. The method according to claim 16, the film layer to be masked is an alignment material layer, and the polarized light emitted by the light emitting element is used to align the alignment material layer.

* * * * *